US009465712B2

(12) United States Patent
Thomas et al.

(10) Patent No.: US 9,465,712 B2
(45) Date of Patent: Oct. 11, 2016

(54) ASSESSMENT OF A HIGH PERFORMANCE COMPUTING APPLICATION IN RELATION TO NETWORK LATENCY DUE TO THE CHOSEN INTERCONNECTS

(71) Applicant: Silicon Graphics International Corp., Fremont, CA (US)

(72) Inventors: Daniel Thomas, Paris (FR); John Baron, Burnsville, MN (US)

(73) Assignee: Silicon Graphics International Corp., Milpitas, CA (US)

( * ) Notice: Subject to any disclaimer, the term of this patent is extended or adjusted under 35 U.S.C. 154(b) by 24 days.

(21) Appl. No.: 13/928,050

(22) Filed: Jun. 26, 2013

(65) Prior Publication Data

US 2015/0007198 A1     Jan. 1, 2015

(51) Int. Cl.
*G06F 3/00* (2006.01)
*G06F 11/34* (2006.01)

(52) U.S. Cl.
CPC ....... *G06F 11/3404* (2013.01); *G06F 11/3419* (2013.01); *G06F 11/3466* (2013.01); *G06F 11/3428* (2013.01); *G06F 11/3461* (2013.01)

(58) Field of Classification Search
CPC ....................................................... G06F 9/54
USPC ....................................................... 719/310
See application file for complete search history.

(56) References Cited

U.S. PATENT DOCUMENTS

| | | | |
|---|---|---|---|
| 6,721,941 B1 * | 4/2004 | Morshed et al. | 717/127 |
| 7,006,448 B1 * | 2/2006 | Thio | 370/252 |
| 7,653,900 B2 * | 1/2010 | Kinderknecht et al. | 717/163 |
| 8,527,959 B2 * | 9/2013 | Chung et al. | 717/128 |
| 8,621,484 B2 * | 12/2013 | Ohly et al. | 719/313 |
| 8,661,218 B1 * | 2/2014 | Piszczek et al. | 711/167 |
| 8,738,860 B1 * | 5/2014 | Griffin et al. | 711/122 |
| 8,782,663 B2 * | 7/2014 | Kanetomo | 718/107 |
| 2006/0070089 A1 * | 3/2006 | Shoaib et al. | 719/321 |
| 2012/0126851 A1 * | 5/2012 | Kelem | G06F 15/7867 326/38 |
| 2013/0246683 A1 * | 9/2013 | Natrajan | G06F 11/3051 710/316 |

OTHER PUBLICATIONS

Minh TuanLe, A Graphics to Scalable Vector Graphics Adaptation Framework for Progressive Remote Line Rendering on Mobile devices, 1991.*
Subramoni, H., e al., "A Scalable InfiniBand Network Topology—Aware Performance Analysis Tool for MPI*," *Lecture Notes in Computer Science*, vol. 7640, pp. 439-450, 2013.

* cited by examiner

*Primary Examiner* — Lechi Truong
(74) *Attorney, Agent, or Firm* — Sunstein Kann Murphy & Timbers LLP

(57) ABSTRACT

A method and computer program product for testing a high performance computing application performing a computation within a clustered computer arrangement is disclosed. The high performance computing arrangement performances computations across processors in parallel wherein the processors cooperate to perform the computation. The application can be tested by adding delay and therefore latency to one or more commands inside of the precompiled application. The addition of delay can be used to simulate the performance of different interconnects that are used within the high performance computing arrangement.

17 Claims, 5 Drawing Sheets

```
#  ─────────────────────────────────
#       Benchmark Allreduce
#       #processes=     1152
#  ─────────────────────────────────
```

| #bytes | 0 μs | 0.2 μs | 0.5 μs | 1 μs | 2 μs | 4 μs | 8 μs |
|---:|---:|---:|---:|---:|---:|---:|---:|
| 4 | 17.79 | 20 | 21.79 | 25.39 | 32.19 | 48.2 | 80.65 |
| 8 | 17.57 | 20 | 21.69 | 26.24 | 32.46 | 49.73 | 81.3 |
| 16 | 19.09 | 20.79 | 22.15 | 26.32 | 33.08 | 49.05 | 80.91 |
| 32 | 18.59 | 21.56 | 22.95 | 26.68 | 33.83 | 49.5 | 81.97 |
| 64 | 20.77 | 23.4 | 25.16 | 28.67 | 36.06 | 50.53 | 82.61 |
| 128 | 24.76 | 27.86 | 29.53 | 33.71 | 40.45 | 55.43 | 87.35 |
| 256 | 26.43 | 30.49 | 31.16 | 35.03 | 42.15 | 56.76 | 89.23 |
| 512 | 29.15 | 32.29 | 33.83 | 37.28 | 47.91 | 59.1 | 92.8 |
| 1024 | 33.44 | 38.04 | 38.9 | 42.16 | 51.53 | 63.72 | 96.05 |
| 2048 | 40.78 | 44.57 | 46.49 | 49.26 | 62.78 | 71.37 | 104.51 |
| 4096 | 55.09 | 60 | 61.44 | 63.94 | 73.72 | 84.47 | 115.32 |
| 8192 | 83.26 | 87.58 | 88.05 | 92.48 | 97.09 | 109.77 | 141.77 |
| 16384 | 156.29 | 152.37 | 156.42 | 167.76 | 186.72 | 225.49 | 313.96 |
| 32768 | 212.92 | 206.7 | 211.12 | 223.9 | 251.55 | 306.71 | 432.29 |
| 65536 | 298.07 | 313.03 | 322.99 | 351.43 | 402.68 | 470.52 | 647.12 |

```
#  ─────────────────────────────────
#       Benchmart Allreduce
#       #processes=     1152
#  ─────────────────────────────────
```

| #bytes | 0 μs | 0.2 μs | 0.5 μs | 1 μs | 2 μs | 4 μs | 8 μs |
|---:|---:|---:|---:|---:|---:|---:|---:|
| 2 | 621.27 | 572.05 | 627.43 | 664.93 | 748.89 | 840.98 | 1168.63 |
| 4 | 692.05 | 583.43 | 659.96 | 641.01 | 758.7 | 850.28 | 1154.06 |
| 8 | 715.22 | 607.52 | 625.76 | 660.02 | 757.49 | 867.45 | 1151.43 |
| 16 | 716.56 | 678.77 | 726.12 | 733.17 | 798.15 | 977.07 | 1221.35 |
| 32 | 890.07 | 848.6 | 851.68 | 889.55 | 983.38 | 1120.91 | 1375.02 |
| 64 | 1452.29 | 1479.55 | 1511.82 | 1542.46 | 1614.51 | 1760.6 | 2044.56 |
| 128 | 2488.73 | 2517.69 | 2541.53 | 2577.59 | 2641.93 | 2796.33 | 3097.14 |
| 256 | 4407.53 | 4444.01 | 4456.72 | 4490.77 | 4543.93 | 4673.01 | 4964.58 |
| 512 | 7606.1 | 7587.22 | 7573.12 | 7608.56 | 7687.75 | 7825.25 | 8099.23 |
| 1024 | 12433.16 | 12717.74 | 12498.36 | 12592.07 | 12542.44 | 12718.03 | 12843.2 |
| 2048 | 22684.59 | 23145.69 | 22932.1 | 22813.55 | 22822.5 | 22954.37 | 23153.1 |
| 4096 | 51813.73 | 52302.5 | 51925.26 | 51532.1 | 51560.5 | 51815.89 | 51779.71 |
| 8192 | 99324.23 | 99511.84 | 99394.97 | 99608.39 | 99834.56 | 99658.99 | 99005.59 |
| 16384 | 198135.6 | 197737 | 198923.7 | 198488.5 | 198016.7 | 199999.3 | 198348.5 |
| 32768 | 390056.7 | 392183.8 | 387346.4 | 389724.8 | 386417.4 | 391148.2 | 388249.6 |
| 65536 | 705814.5 | 704088.6 | 703792.4 | 703114.1 | 703231.4 | 705508.7 | 703185.1 |

*FIG. 5*

ASSESSMENT OF A HIGH PERFORMANCE COMPUTING APPLICATION IN RELATION TO NETWORK LATENCY DUE TO THE CHOSEN INTERCONNECTS

TECHNICAL FIELD

The present invention relates to high performance computing, and more particularly to introducing latency into commands in a compiled application during runtime to simulate different interconnects between nodes and switches.

BACKGROUND ART

High performance computing ("HPC") systems perform complex or data-intensive calculations using a large number of computing nodes. For example, some HPC systems may be used to multiply matrices that have thousands or even hundreds of thousands of rows and form outer products of vectors having hundreds of thousands of elements. HPC software developers break up such problems into smaller problems that may be executed with relative independence. For example, in a matrix multiplication C=A*B, calculating the value of an element in the matrix C requires as input only a single row of the matrix A and a single column of the matrix B. Thus, the overall multiplication can be divided into a number of independent sub-problems, each of which may be solved by a different node in the HPC system. Such systems use a parallel programming paradigm such as a message-passing interface (MPI).

MPI is a standardized and portable message-passing system that defines the syntax and core library routines that can be used by hardware vendors to create and control a distributed computing system.

Purchasers of an HPC system desire to obtain the best performance vs. cost. Thus, testing of system components (cores, co-processors, processors, switches and interconnect) with a known application to see how the components affect performance is desirable using analytical tools for the HPC system. Given the complexity and size of such systems, testing often occurs through simulation or testing of selected groupings of components. For example, a real HPC system may exist that has 100 nodes with 800 cores with an Infiniband switching fabric. A potential purchaser may wish to know what the impact would be if the switching fabric was switched to a different switching fabric (e.g. fibre channel, PCI express, serial ATA, etc.). A change to a slower switching fabric may result in latency in the transmission of instructions. Thus, the potential purchaser may wish to know whether the selection of a slower fabric would affect the performance of their application.

On way to perform such a test would be to replace the switching fabric in an existing HPC system. However, this is prohibitively expensive. Thus, there is a need for testing an HPC system without having to replace the components of the system.

SUMMARY OF THE EMBODIMENTS

In a first embodiment of the invention there is provided a method for testing a high performance computing application performing a computation within a high performance computing arrangement. An application includes multiple processes working in conjunction to complete the calculation. Often processes are mapped to processor cores in a one-to-one or a one-to-many configuration. The high performance computing arrangement performs computations across processors in parallel wherein processes cooperate to perform the computation using the processors. The application can be tested using a performance-profiling tool that can add delay and therefore latency to one or more commands inside of the precompiled application. The addition of delay can be used to simulate the performance of different interconnects that are used within the clustered computing arrangement. First, a performance-profiling tool is executed on the clustered computer arrangement having an associated first interconnect. The first interconnect has an associated performance characteristic. The performance-profiling tool is added to the command line in order to set up the appropriate environment in which the MPI calls will be intercepted by the profiling library. At least one command within the application is intercepted prior to execution within the high performance commuting arrangement. The command may be an MPI (message passing interface) command, such as a send command. The intercepted command is then delayed by a predetermined length of time. The time for completion of the command is recorded and stored for retrieval, computation and display. The amount of time that the message is delayed may be associated with an interconnect that is different from the interconnect within the high performance computing arrangement. The Completion time for the computation of the application with the added delay can then be compared to the completion time for the computation of the application without the added delay. It should be recognized that the computation may be performed multiple times by the application and the delay may be added to each occurrence.

An output signal representative of the comparison of the completion times for the computation with and without the introduced delay can be produced and the output signal can be displayed on a display device. The completion times can be further processed and displayed as a histogram on a display device. This provides a user with a tool for analyzing the consequence of latency within the clustered computing arrangement on the overall performance of the execution of an application. Different latencies may be ascribed to different types of interconnects and therefore, tests on one clustered computing arrangement can be used to simulate the results of replacing the interconnect.

The computation within the application may be associated with a function within a library, such as a dynamically linked library. The application may be compiled and the library linked with the computation. Thus, the library includes at least one or more commands and associated computing code for executing the command. Upon execution of the application, the application is linked with a second library, which may be a dynamically linked library. This replaces the linkage to the first library. The second library includes executable code for at least the same command as the first library, but includes at least one additional feature. The additional feature may be adding delay to the command before executing the command. In embodiments of the invention, the command may be a send command, such as a message passing interface send command. The send command from the second dynamically linked library includes a call to the first dynamically linked library for further execution of commands within the first library. This call may allow for the use of the send command within the first library.

The display of the resulting output signal can represent the impact of the selection of a second interconnect as compared to a first interconnect.

The disclosed methodology may be embodied as computer program code on a non-transient computer readable medium as a computer program product. The computer code on the computer program product may be part of the performance-profiling tool or may be a separate application that integrates with the performance-profiling tool.

BRIEF DESCRIPTION OF THE DRAWINGS

The foregoing features of embodiments will be more readily understood by reference to the following detailed description, taken with reference to the accompanying drawings, in which:

FIG. 5 shows the results of tests for two applications in which variable amounts of latency have been added to commands within the applications.

DETAILED DESCRIPTION OF SPECIFIC EMBODIMENTS

Definitions. As used in this description and the accompanying claims, the following terms shall have the meanings indicated, unless the context otherwise requires:

"MPI" refers to the standard message passing interface along with the standard functions used in high performance computing systems as known to one or ordinary skill in the art.

"High performance computing" ("HPC") refers to multi-nodal, multiple core, parallel processing systems wherein control and distribution of the computations is performed using a standard such as MPI.

"Performance profiling tool" is an application that allows for the capture of performance information about a HPC system when an application is run on the HPC system with test data. Performance profiling tools capture information such as execution time, send times and receive times, hardware counters, cycles, memory accesses and other MPI communications. The performance profiling tool can collect this performance data and then can provide outputs including both text and graphs that provide a report of the performance of the HPC system.

The present invention as described in the embodiments below is directed to the insertion of delay for commands (e.g. send, receive, test, wait) in an already pre-compiled application where the application is being tested on an HPC (high performance computing) system using a performance profiling tool. Examples of profiling tools include Silicon Graphics MPInside, the TAU Performance System, the gprof profiler, the IPM MPI profiler, and Jumpshot for example. High performance computing systems employ 10s, 100s, and even 1000s of processors that perform parallel processes in order to execute applications that are both data and computationally complex.

Figure 1:
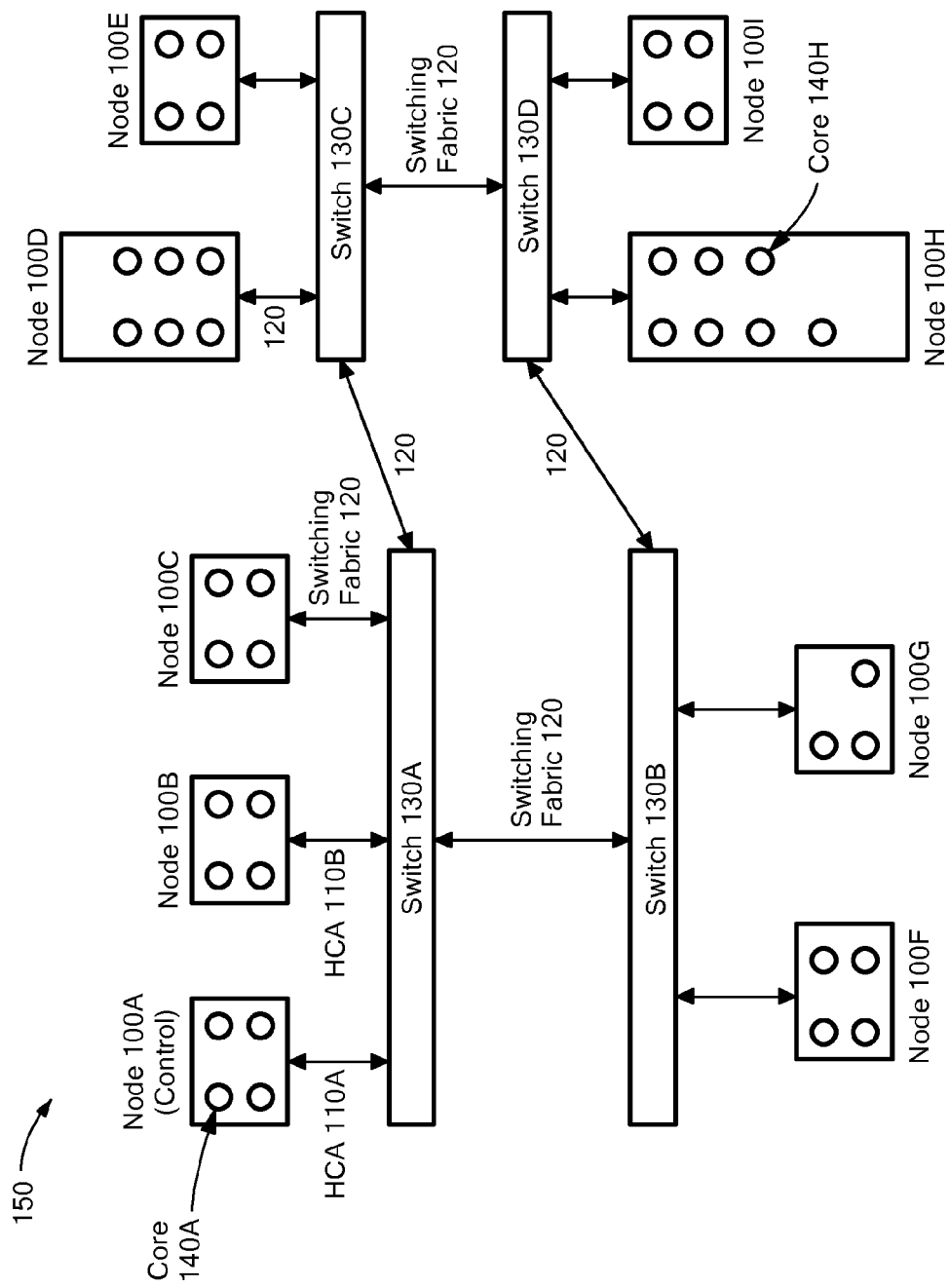
FIG. 1 show an exemplary high performance computing environment that includes a plurality of cores, nodes, switches and switching fabric.

FIG. 1 show an exemplary high performance computing (HPC) environment 150 that includes a plurality of cores 10A-H, nodes 100A-I, switches 130A-D and switching fabric 120 in a computing cluster, which is a centralized parallel computing structure.

As shown, there are nodes that link together one or more processing cores (e.g., Node 100A has four cores and Node 100D has six). The processing cores may be part of a multi-core processing structure (dual-core, quad-core, six-core etc.), such as central processing units made by such companies as Intel and AMD. A node may have more than one CPU and may share resources such as memory. FIG. 1 shows two types of nodes a control or master node 100A (control) and computational nodes 100B-I.

In cluster computing architectures, the speed and flexibility of the interconnect affect performance. Generally, Infiniband switching fabrics are employed, but other switching fabrics may be used including Gigabit Ethernet. For Infiniband switching fabrics, the Infiniband architecture defines a connection between processor nodes and high performance storage devices. At each end of the switching fabric is either a host bus adapter/host channel adapter HCA or a network switch. The switching fabric offers point-to-point and bidirectional serial links for coupling the processors to peripherals such as high-speed storage. The switches communicate with each other and transfer data and instructions between nodes and cores of the nodes.

Figure 2:
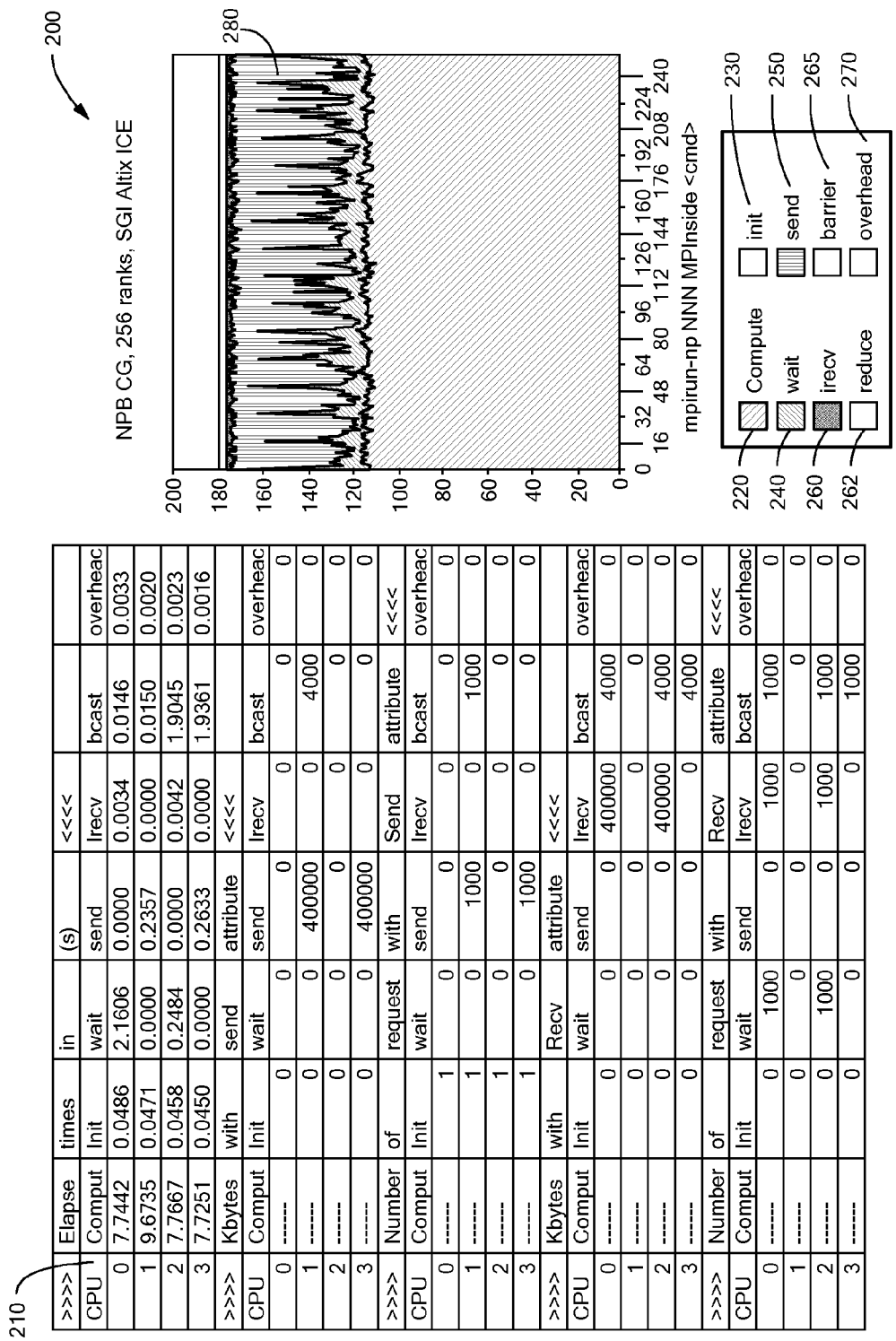
FIG. 2 shows an exemplary screen shot showing data that can be obtained as the result of running a profiling environment when operating an application within a clustered high performance computing environment.

FIG. 2 shows an exemplary screen shot 200 showing data that can be obtained as the result of running a performance profiling tool when executing an application within a clustered high performance computing environment. In the present example, information that can be obtained includes a listing of the various CPU's (0, 1, 2, 3) 210 along with the elapsed computational time 220, the time to initialization 230, waiting time 240, sending time 250, time for non-blocking receive (MPI irecv) 260, reduce 262, barrier 265 and overhead 270. In the example, there are 256 ranks and the testing was performed on an SGI Altix ICE HPC system. In addition, to the numerical data regarding the timing of events, the data may be presented in a graphical fashion as a histogram 280 to show how each event (e.g. send, receive, wait) contributes to the processing of the application.

As previously noted, when a procurement of an HPC system is desired a balance between price and performance is made. A person or organization looking to purchase an HPC system will look at the benchmarks for running the organization's applications. It is generally presumed by those of ordinary skill in the art that the interconnect and latency may be one of the major contributions to the performance of an HPC system. Thus, it would be useful to be able to test applications on an HPC system with a known topology and compare interconnects and their respective latencies and determine how the interconnects affect the performance of the application. This functionality is achieved by adding latency to function calls that exist within a precompiled application. The chosen amount of latency for a command can be a variable amount (e.g. 10, 50, 100 microseconds for Ethernet variants and 1, 5, 10 microseconds for Infiniband networks). The selected amount of latency to add may be based upon tests performed for various interconnects, wherein an interconnect may be known to have a certain amount of latency compared to another interconnect.

Figure 3:
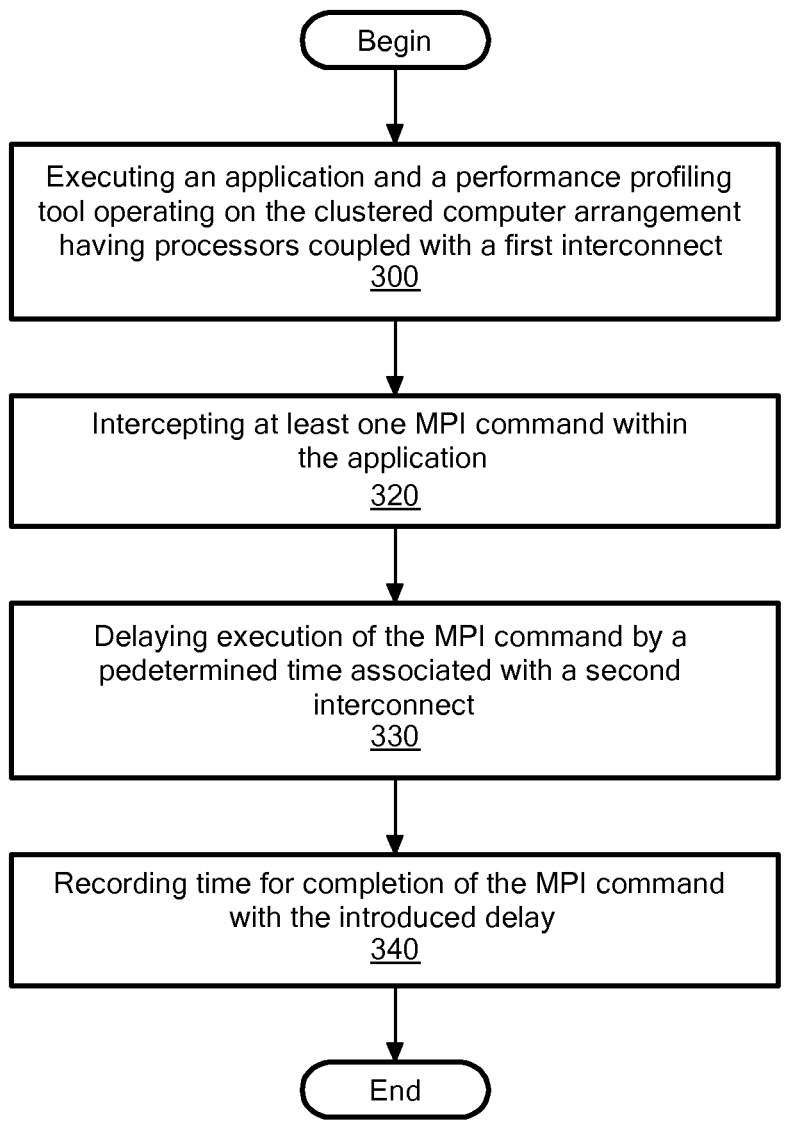
FIG. 3 shows a flow chart of a method for adding latency to commands during execution of a program in a clustered computing environment without the need for recompilation of the application.

FIG. 3 shows a flow chart of a method for adding latency to commands during execution of a program in a clustered computing environment without the need for recompilation of the application.

First, an application is executed including a performance-profiling tool within an HPC system including a clustered computer arrangement having a plurality of processors for testing the performance of an application 300. The profiling tool is added to the command line in order to set up the appropriate environment in which the MPI calls will be intercepted. This process may be manual or automated. Other methods for having simultaneous operation of a profiling tool and an application executing in the same environment are known to those of ordinary skill in the art. The performance-profiling tool logs information about the transactions that occur at different hardware locations within the HPC system, such as a clustered computer environment. The performance profiling tool intercepts at least one command from the application 320. For example, the performance profiling tool may intercept any send command, such as an MPI send command.

The performance profiling tool may use a form of function interposition to redirect the application to a different library during runtime. Thus, a function that is an internal routine of a library, such as the standard MPI dynamically linked library, may be redirected to a separate dynamically linked library during runtime that includes a function that has the same attributes and additional features (e.g. delaying a start time). This function in the runtime dynamically linked library causes the delay of the function to be executed when the application is run 330. Thus, before a processor within the HPC system issues an MPI send command, the tool, using the runtime dynamically linked library, intercepts the MPI send command and runs a send function from the runtime dynamically linked library that includes the delay feature. The addition of delay may be used for testing a number of different scenarios and may be employed with any function that is part of the dynamically linked library that is linked at compile time and referenced in the compiled application being tested.

The delay can be used to simulate different interconnects that have different inherent latency relative to the interconnect that is being used in the HPC system. After the delay has been added, the time for completion of the MPI command (e.g. the send command) can be logged by the performance profiling tool and saved to memory 340. The performance profiling tool will then output a data set of the logged data, perform computations and provide an output display with the performance data for display on a display device. The output display may be similar to that shown in FIG. 2 or may simply be a data listing as shown in the example of FIG. 5 as discussed below.

Figure 4:
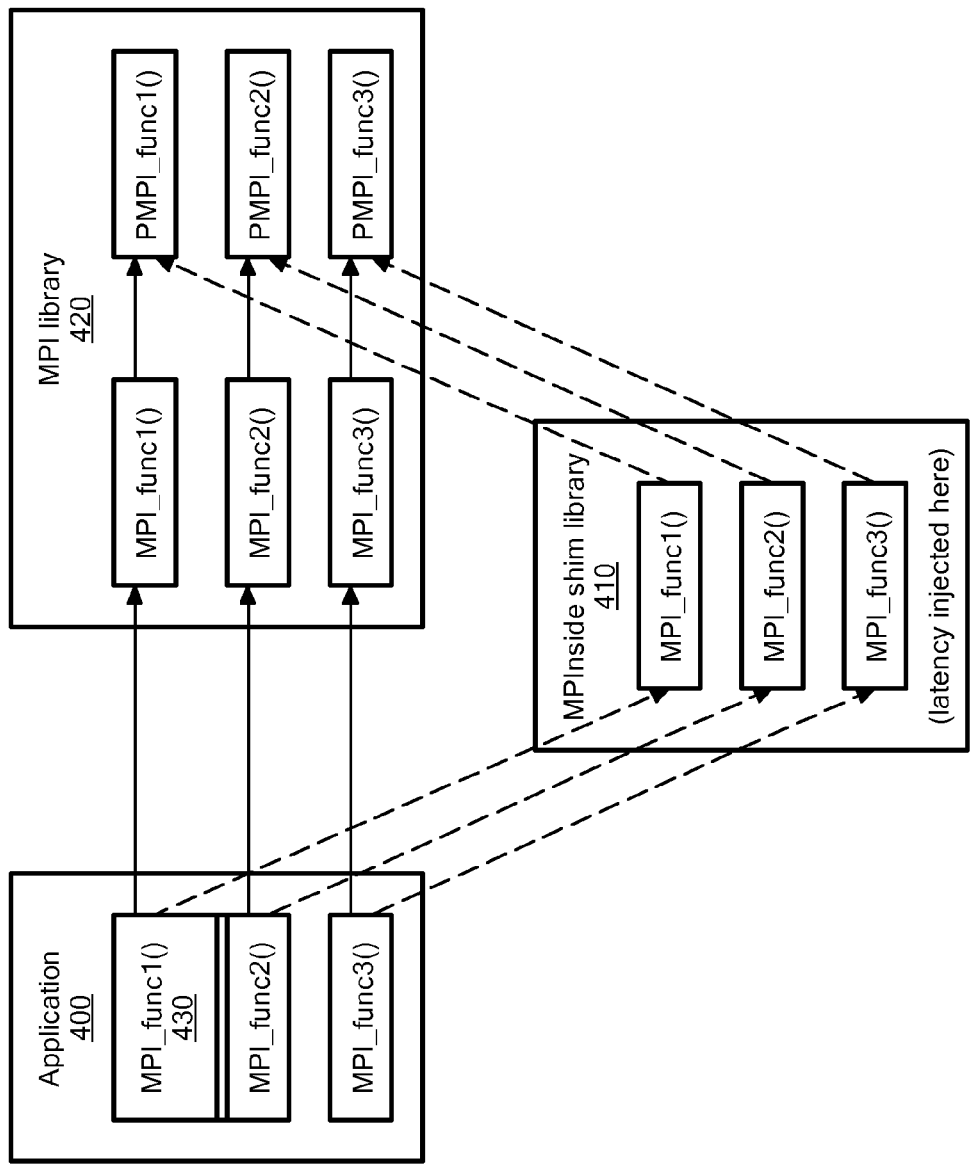
FIG. 4 shows an exemplary schema for using a dynamically linked library at runtime that is different from the dynamically linked library that is used during compilation of the application.

FIG. 4 shows an exemplary schema for using a dynamically linked library at runtime that is different from the dynamically linked library that is used during compilation of the application. An application 400 contains a plurality of functions (MPI_func1( ), MPI_func2( ), etc.). The functions are associated with computer code within a dynamically linked library.

For example, MPI_func1( ) 430 refers to code in library MPI library 420. MPI library 420 is linked to the application during compilation. One way of adding delay to function1 would be to rewrite and recompile the application. The present invention as disclosed provides a means for adding the delay to function1 without the need for recompilation. At runtime, the performance-profiling tool causes the application to be redirected from the standard library for function1 MPI library 420 to a runtime library MPInside shim library 410.

MPInside shim library includes a function named MPI_func1( ) that includes adding delay to the execution of MPI_func1( ). This redirection from a first linked library to a second runtime library may be achieved using different computing techniques known in the art. For example, the dlopen/dlsym mechanism may be employed. Dlopen may be used to call the MPI library 420 from within MPInside shim library 410. Additionally, the runtime library MPInside shim library 410 will associate a pointer to the address of function1 inside the compile time library MPI library 420.

It should be recognized that a latency injector could be built independent of the performance-profiling tool. The latency injector could simply be made as a library that is preloaded and that has a function with the same attributes that includes the injection of delay as a function that is being linked dynamically at runtime.

FIG. 5 shows the results of tests for two applications in which variable amounts of latency have been added to commands within the applications. As shown, a first application called Allreduce is run within a system that contains 1152 processors (cores). Test data starting with 4 bytes of data through 65,536 bytes of data are passed through the HPC system. Delay is added to the system and as shown the baseline is performed with no added delay and then delays of 0.2, 0.5, 1, 2, 4, and 8 microsecond delays are calculated wherein these delays are added to the MPI send command.

As shown in this example for Allreduce, the delay (latency of the send command) appears to impact performance in a non-linear manner, but it is clear that the latency does affect performance. In contrast, the application Alltoall, which is performed on the same HPC system, experiences less degradation in performance as a result of the delays. This difference is expected because Alltoall is more sensitive to aggregate network bandwidth than latency, particularly at large messages sizes.

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as preprogrammed hardware elements (e.g., application specific integrated circuits, FPGAs, and digital signal processors), or other related components.

In an alternative embodiment, the disclosed apparatus and methods (e.g., see the various flow charts described above) may be implemented as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium.

The medium may be either a tangible medium (e.g., optical or analog communications lines) or a medium implemented with wireless techniques (e.g., WIFI, microwave, infrared or other transmission techniques). The series of computer instructions can embody all or part of the functionality previously described herein with respect to the system. The process of FIG. 2 is merely exemplary and it is understood that various alternatives, mathematical equivalents, or derivations thereof fall within the scope of the present invention.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method, in a high performance computing (HPC) arrangement comprising multiple computing nodes that cooperate to perform a computation using a switching fabric for distributing messages between the multiple computing nodes, the method comprising:
    measuring a first performance profile of an application pre-compiled using a first dynamically linked library for performing the computation using the multiple computing nodes on the HPC arrangement, wherein measuring the first performance profile includes recording a first time for completing an inter-node command of the pre-compiled application using a first switching fabric;
    simulating execution of the application on a second switching fabric by measuring a second performance profile of the pre-compiled application on the HPC arrangement, wherein measuring the second performance profile includes recording a second time for completing the inter-node command using the second switching fabric, wherein the second switching fabric is simulated by transmitting the inter-node command through the first switching fabric after introducing, by a second dynamically linked library that calls the first dynamically linked library, a delay of a predetermined time associated with the second switching fabric; and
    modeling an effect of the delay on performance of the pre-compiled application by comparing the first performance profile with the second performance profile.

2. The method according to claim 1, wherein comparing the first performance profile with the second performance profile includes comparing completion times for the application with the introduced delay and without the introduced delay.

3. The method according to claim 2, wherein the high performance computing arrangement produces an output signal representative of the comparison of the completion times for the computation with and without the introduced delay.

4. The method according to claim 3, further comprising displaying the output signal on a display device.

5. The method according to claim 4, wherein the display of the output signal indicates an impact of the use of the second switching fabric as compared to the first switching fabric between compute nodes within the high performance computing arrangement.

6. The method according to claim 1, wherein the inter-node command is a send command for sending data between compute nodes using the first switching fabric.

7. The method according to claim 6, wherein the second dynamically linked library causes the high performance computing arrangement to delay the execution of the send command.

8. The method according to claim 1, wherein the application is an MPI (Message Passing Interface) application and the command is an MPI command.

9. The method according to claim 1, wherein the high performance computing arrangement operates a performance profiling tool for measuring the first performance profile and the second performing profile.

10. A computer program product having a non-transitory computer-readable medium with computer code thereon for carrying out a method, in a high performance computing (HPC) arrangement comprising multiple computing nodes that cooperate to perform a computation using a switching fabric for distributing messages between the multiple computing nodes, the computer code comprising computer code for:
    measuring a first performance profile of an application pre-compiled using a first dynamically linked library for performing the computation using the multiple computing nodes on the HPC arrangement, wherein measuring the first performance profile includes recording a first time for completing an inter-node command of the pre-compiled application using a first switching fabric;
    simulating execution of the application on a second switching fabric by measuring a second performance profile of the pre-compiled application on the HPC arrangement, wherein measuring the second performance profile includes recording a second time for completing the inter-node command using the second switching fabric, wherein the second switching fabric is simulated by transmitting the inter-node command through the first switching fabric after introducing, by a second dynamically linked library that calls the first dynamically linked library, a delay of a predetermined time associated with the second switching fabric; and
    modeling an effect of the delay on performance of the pre-compiled application by comparing the first performance profile with the second performance profile.

11. The computer program product according to claim 10, wherein the computer code for modeling the effect of the delay on performance of the pre-compiled application comprises computer code for comparing completion times for the computation of the application with the introduced delay and without the introduced delay.

12. The computer program product according to claim 11, further comprising:
    computer code for producing an output signal representative of the comparison of the completion times for the computation with and without the introduced delay.

13. The computer program product according to claim 12, further comprising:
    computer code for displaying the output signal on a display device.

14. The computer program product according to claim 13, wherein the display of the output signal indicates the impact of the use second switching fabric as compared to the first switching fabric between compute nodes within the high performance computing arrangement.

15. The computer program product according to claim 10, wherein the inter-node command is an MPI (Message Passing Interface) send command for sending data between compute nodes using the first switching fabric.

16. The computer program product according to claim 15 wherein the second dynamically linked library causes the high performance computing arrangement to delay the execution of the MPI send command.

17. The computer program product according to claim 10, wherein a performance profiling tool operates within the high performance computing arrangement for measuring the first performance profile and the second performance profile.

* * * * *